United States Patent [19]

Kristiansen

[11] 3,963,944
[45] June 15, 1976

[54] DEVICE FOR CONVERTING AN ANALOGOUS SIGNAL INTO A PULSE-LENGTH-MODULATED PULSE SERIES

[75] Inventor: Leif Kristiansen, Trangsund, Sweden

[73] Assignee: Cemo Instruments AB, Vallingby, Sweden

[22] Filed: Nov. 20, 1974

[21] Appl. No.: 525,452

[30] Foreign Application Priority Data

Nov. 23, 1973 Sweden.............................. 7315915

[52] U.S. Cl............................... 307/265; 329/106; 332/15; 328/115; 328/150; 328/151
[51] Int. Cl.² ...................... H03K 1/12; H03K 1/18
[58] Field of Search................... 328/115, 150, 151; 329/106; 332/15; 307/265

[56] References Cited
UNITED STATES PATENTS

| 3,333,109 | 7/1967 | Updike | 328/151 X |
| 3,555,298 | 1/1971 | Neelands | 328/151 |
| 3,613,018 | 10/1971 | Sitnichenko et al. | 328/151 |
| 3,719,834 | 3/1973 | Dao | 307/265 |
| 3,731,209 | 5/1973 | Satterfield | 328/151 |
| 3,764,921 | 10/1973 | Huard | 328/151 |
| 3,800,167 | 3/1974 | Smith | 307/265 |
| 3,801,834 | 4/1974 | Lai | 307/265 |

FOREIGN PATENTS OR APPLICATIONS

| 944,664 | 12/1963 | United Kingdom | 332/15 |
| 907,743 | 10/1962 | United Kingdom | 332/15 |
| 603,196 | 6/1948 | United Kingdom | 332/15 |

Primary Examiner—Saxfield Chatmon, Jr.
Attorney, Agent, or Firm—Kenway & Jenney

[57] ABSTRACT

A device for converting an analogous signal having a varying amplitude into a pulse series having a pulse length proportional to the present amplitude value of the analogous signal comprises a capacitor, a sample pulse generator for generating sample pulses of a predetermined frequency, means responsive to the sample pulses for connecting the capacitor temporarily during each sample pulse to a potential proportional to the present amplitude value of the analogous signal and to a direct current source so that the capacitor is charged to a voltage proportional to the amplitude value of the analogous signal and for isolating the capacitor from the direct current source and said potential during the intervals between the sample pulses, a constant current path connected in parallel across the capacitor for discharging the capacitor during the intervals between the sample pulses, a pulse shaping circuit responsive to the current flowing through the constant current path for generating a signal pulse when no current flows through the constant current path, and a logic circuit receiving said signal pulses and the sample pulses and providing an output signal having a first signal level, when neither a signal pulse from the pulse shaping circuit nor a sample pulse is received, and a second signal level under all other conditions.

3 Claims, 3 Drawing Figures

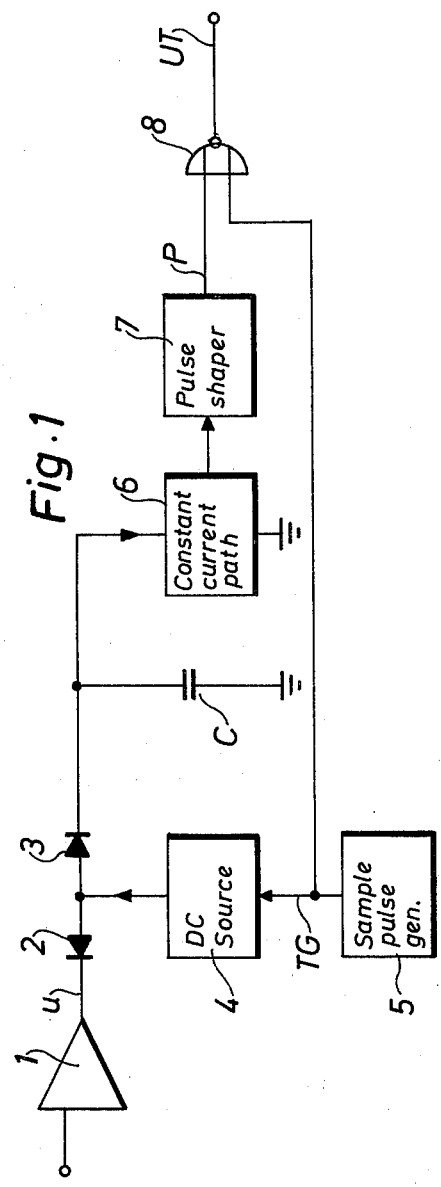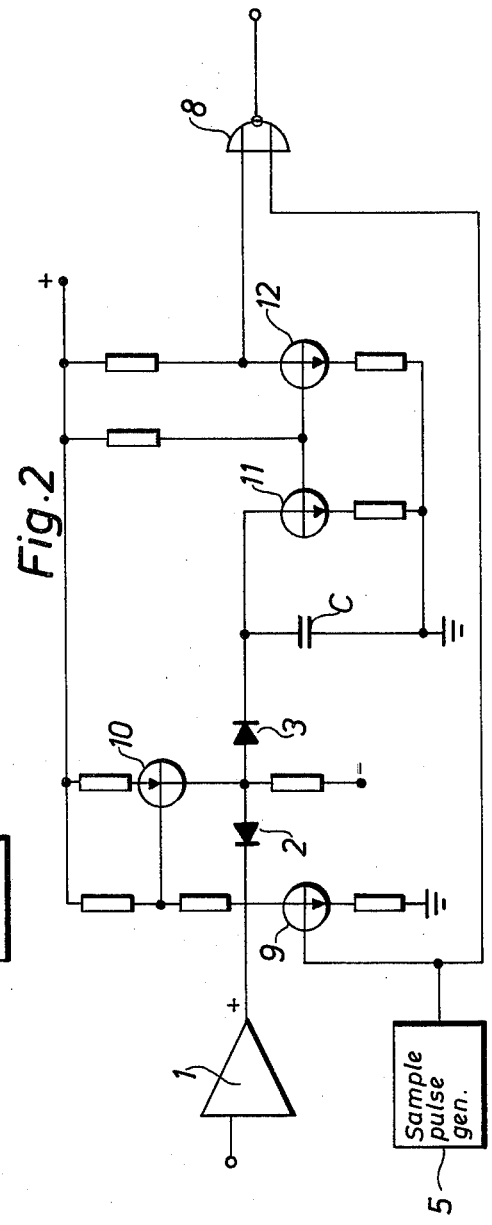

DEVICE FOR CONVERTING AN ANALOGOUS SIGNAL INTO A PULSE-LENGTH-MODULATED PULSE SERIES

The present invention is related to a device for converting an analogous signal having a varying amplitude into a puls series having a pulse length which is proportional to the present value of the amplitude of the analogous signal. The device is of the general type comprising a capacitor, a sample pulse generator generating sample pulses with a predetermined frequency, charging circuit means responsive to the pulses generated by the sample pulse generator and the analogous signal for periodically charging the capacitor during each sample pulse to a voltage proportional to the present amplitude of the analogous signal, and discharging circuit means for discharging the capacitor during the intervals between the sample pulses and for determining the duration of each discharging of the capacitor.

In the processing of analogous signals it is well known that it is advantageous in many instances to convert the information contained by the analogous signal into a different type of signal representation, which is better suited for the subsequent processing of the information contained in the original analogous signal. This is generally performed by periodically sampling the amplitude value of the analogous signal at periodic discrete instants and converting each sampled amplitude value into a desired signal representation.

The object of the present invention is to provide a device for sampling an analogous signal and converting each sampled signal value into a signal pulse having a length directly proportional to the sampled value, i.e. expressed in another way a device for converting an analogous signal having a varying amplitude into a pulse series having a predetermined pulse frequency but a pulse length which is proportional to the present amplitude value of the analogous signal. Such a conversion of an analogous signal may be preferable in many connections. Thus, for instance, the generated pulse series having a pulse length proportional to the present amplitude value of the analogous signal can be used for gating a clock pulse series, whereafter the gated clock pulses can be used for digital data processing.

Devices for converting an analogous signal having a varying amplitude into a pulse series having a pulse length proportional to the present amplitude value of the analogous signal are previously known in the art. These prior art devices comprise generally a capacitor, charging circuit means controlled by a sample pulse generator for charging the capacitor periodically during each sample pulse to a voltage proportional to the present amplitude value of the analogous signal, discharging circuit means for discharging the capacitor in the intervals between the sample pulses and pulse shaping circuit means for determining the duration either of each charging or each discharging of the capacitor and for providing an output pulse having a length equal to said duration. In order to obtain a high accuracy it is necessary that the charging as well as the discharging of the capacitor is very accurate so that the capacitor is charged to a potential, which is accurately proportional to the present amplitude of the analogous signal, and is discharged to a very well-defined and constant potential. Further, the charging rate of the capacitor must be very well-defined and constant, if the duration of each charging of the capacitor is measured, or alternatively the discharge rate of the capacitor must be very well-defined and constant, if the duration of each discharging of the capacitor is measured. Finally, it is required for good accuracy that the duration of each charging or discharging, as the case may be, of the capacitor is measured very accurately, i.e. that the beginning and the end of the charging or discharging respectively, can be detected with high accuracy. Most prior art devices of this type for converting an analogous signal into a pulse series having a pulse length proportional to the present amplitude value of the analogous signal are unsatisfactory in one or several of the above respects.

The object of the present invention is therefore to provide an improved device of the type mentioned above for converting an analogous signal having a varying amplitude into a pulse series having a pulse length proportional to the present amplitude value of the analogous signal, which device has a high accuracy independent of external influences as for instance temperature variations.

The invention provides a device for converting an analogous signal having a varying amplitude into a pulse series having a pulse length proportional to the present value of the amplitude of the analogous signal, comprising a capacitor, a sample pulse generator providing sample pulses at a predetermined frequency, charging circuit means responsive to said sample pulses and said analogous signal for charging the capacitor during each sample pulse to a potential proportional to the present amplitude value of the analogous signal, and discharging circuit means for discharging the capacitor during the intervals between said sample pulses and for determining the duration of each discharging of the capacitor, characterized in that said discharging circuit means include a constant current path connected in parallel across the capacitor and means responsive to the current through said constant current path for producing a signal pulse in the absence of a current through said constant current path, and that logic circuit means are provided to receive the sample pulses from said sample pulse generator and the signal pulses from said current responsive means and to provide an output signal having a first signal level, when neither a sample pulse nor a signal pulse is received, and a second signal level under all other conditions.

In a preferred embodiment of the invention the constant current path includes a first transistor having its collector-emitter path connected in parallel across the capacitor and its base biased to maintain the transistor in a saturated conducting state, and said current responsive means include a second transistor having its base interconnected with the base of said first transistor and its base-emitter path connected in parallel to the base-emitter path of the first transistor, whereby said second transistor is conducting, when current is flowing through the collector-emitter path of the first transistor, and is blocked, when no current flows through the collector-emitter path of the first transistor, and said signal pulses are provided on the collector of said second transistor.

According to a further preferred embodiment of the invention the charging circuit means includes an amplifier controlled by the analogous signal for providing an output potential proportional to the amplitude of the analogous signal, the capacitor being connected to the output of said amplifier through two diodes connected in series in opposite directions, and a direct current source connected to the junction between said two diodes so as to feed current in the forward direction of said two diodes, and said direct current source being controlled by said sample pulses so as to be turned on during the sample pulses and cut off during the intervals between the sample pulses.

The nature of the invention will be more clearly understood from the following description of an embodiment thereof illustrated by way of example in the accompanying drawings, in which:

FIG. 1 is a schematic block diagram of a device according to the invention for converting an analogous signal into a pulse series having a pulse length proportional to the present amplitude value of the analogous signal;

FIG. 2 is a more detailed circuit diagram for the device illustrated in FIG. 1.

Figure 3:
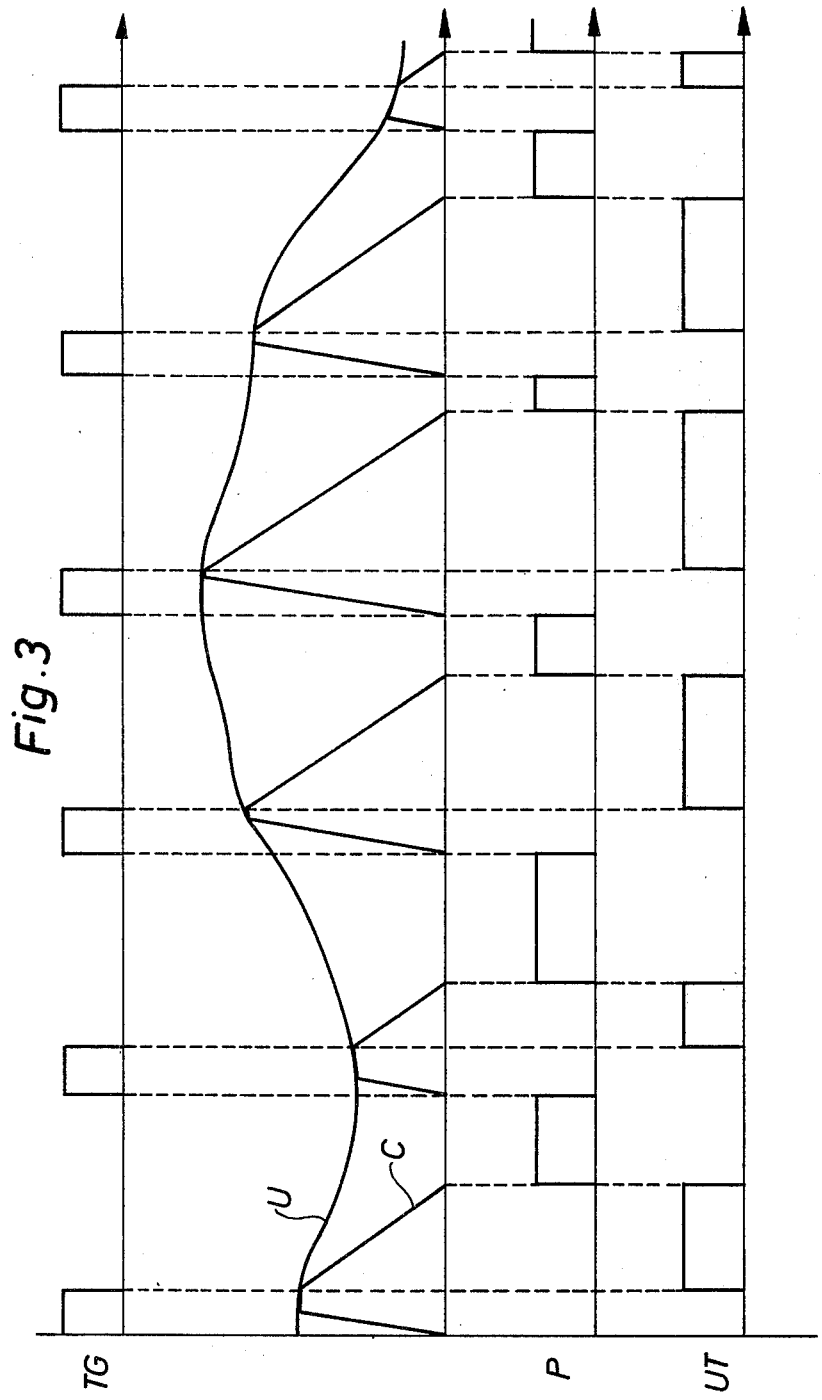
FIG. 3 is a diagram graphically illustrating some signals at various points in the device illustrated in FIGS. 1 and 2.

The device according to the invention illustrated by way of example in FIG. 1 comprises an amplifier 1, which may be of any suitable conventional type and which receives on its input the analogous signal and provides on its output a potential U, which varies in accordance with the variations of the amplitude of the analogous input signal. The output of the amplifier 1 is connected to a capacitor C through two diodes 2 and 3 connected in series with opposite directions. A direct current source 4 is connected to the junction between the two diodes 2 and 3 so that the direction of the current from the current source coincides with the forward direction of the diodes 2 and 3. The current source 4 is controlled by a sample pulse generator 5, which generates a series of sample pulses TG of a predetermined frequency, in response to which the current source 4 is alternatingly turned on to supply a predetermined constant current during the sample pulses TG and cut off during the intervals between the sample pulses. A constant current path 6 is connected in parallel across the capacitor C. This constant current path 6 passes a predetermined constant current so long as a voltage is present across the capacitor C, but leads no current in the absence of a voltage across the capacitor C. Further, the device comprises a pulse shaper 7, which is controlled from the constant current path 6 so as to provide a signal pulse P on its output when no current is flowing through the constant current path 6. The signal pulses P from the pulse shaper 7 and the sample pulses TG from the sample pulse generator 5 are supplied to a nor-circuit 8, which provides on its output the desired pulse series UT having a pulse length proportional to the present value of the amplitude of the analogous input signal to the amplifier 1.

The operation of the device in FIG. 1 will be described more in detail with reference to the graphical presentation in FIG. 3, which shows the sample pulses TG from the sample pulse generator 5, the potential U on the output of the amplifier 1 which varies in accordance with the amplitude of the analogous input signal to the amplifier, the voltage across the capacitor C, the signal pulses P at the output of the pulse shaper 7 and the output signal UT from the nor-circuit 8.

In the embodiment of the invention illustrated in FIG. 1 it is assumed that the potential U on the output of the amplifier 1 is positive and that the direct current source 4 is maintained operative during the positive sample pulses TG from the sample pulse generator 5 and supplies a substantially constant current in the forward direction of the diodes 2 and 3. During the intervals between the sample pulses TG from the sample pulse generator 5 the current source 4 is on the other hand cut off, wherefore the potential on the junction between the diodes 2 and 3 is "floating". Further, it is assumed that in its operating condition the direct current source 4 supplies a current substantially exceeding the current value of the constant current path 6.

When the current source 4 is turned on by a sample pulse TG from the sample pulse generator 5, a portion of the current supplied by the current source 4 flows through the constant current path 6, whereas the remaining and larger portion of the current charges the capacitor C. It is understood that the capacitor C will be charged only up to the existing potential U on the output of the amplifier 1 (compare FIG. 3). When subsequently the current source 4 is cut off at the end of the sample pulse TG from the sample pulse generator 5, the capacitor C starts to discharge with a constant current, that is at a constant rate, through the constant current path 6. As the capacitor C was charged to the potential U and is discharged with a constant current and thus at a constant rate, the duration of the discharging of the capacitor will be directly proportional to the potential U (compare FIG. 3). During the sample pulse TG, when the current source 4 is operative and supplies current, as well as during the subsequent discharging of the capacitor C a constant current flows through the constant current path 6, wherefore the pulse shaper 7 does not provide any signal pulse (a low signal level) on its output (compare FIG. 3). When the capacitor C is fully discharged, the current ceases to flow through the constant current path 6, which influences the pulse shaper 7 to provide a signal pulse (high signal level) on its output (compare FIG. 3). When the next sample pulse TG from the sample pulse generator 5 turns on the current source 4 once more to start a renewed charging of the capacitor C, current starts to flow once again through the constant current path 6, whereby the signal pulse P on the output of the pulse shaper 7 is interrupted.

The sequence of operation described above is repeated for each sample pulse TG generated by the sample pulse generator 5.

The signal pulses P from the pulse shaper 7 and the sample pulses TG from the sample pulse generator 5 are supplied to the inputs of the nor-circuit 8, which produces consequently on its output a pulse (a high level signal), when no pulses (low signal level) are present on either the output of the pulse shaper 7 or the output of the sample pulse generator 5. The pulse series UT on the output of the nor-circuit 8 is consequently made up of pulses with the same pulse frequency as the sample pulses TG but with a varying pulse length, as illustrated in FIG. 3. It is appreciated that each pulse in the pulse series UT starts simultaneously with the beginning of a discharging of the capacitor C, i.e. simultaneously with the rear edge of the corresponding sample pulse TG, and ends simultaneously with the end of the discharging of the capacitor C, wherefore consequently the length of each pulse in the pulse series UT is directly proportional to the present value of the potential U on the output of the amplifier 1 and thus to the present value of the amplitude of the analogous signal connected to the input of the amplifier 1.

It is appreciated that the accuracy of the device is unaffected by possible variations in the pulse frequency and pulse length of the sample pulse generator 5. Neither is the accuracy affected by possible variations in the current supplied by the current source 4. Essential is only that the direct current source 4 supplies a current which is sufficiently large for charging the capacitor C safely upto the potential U on the output of the amplifier 1 during the duration of the sample pulse TG from the sample pulse generator 5. It is appreciated that with this provision the capacitor C is always charged accurately to the potential U on the output of the amplifier 1, as the internal voltage drops of the diodes 2 and 3 are in opposite directions and consequently eliminate one another. This means also that possible variations of the internal voltage drops of the diodes 2 and 3, for instance due to temperature variations, will have no effect on the charging of the capacitor C. It is also appreciated that during the intervals between the sample pulses TG, when the direct current source 4 is cut off, the diodes 2 and 3 keep the capacitor C completely isolated from the current source 4 as well as the amplifier 1, wherefore this circuitry can have no disturbing influence upon the accurate discharging of the capacitor C. For the accuracy of the device it is important, however, that the amplifier 1 is linear and that the current value of the constant current path 6 does not vary so that the discharge time of the capacitor C will actually be proportional to the voltage U to which the capacitor has been charged. Further, it is obviously critical for the accuracy of the device that it is possible to determine accurately the instants when the discharging of the capacitor C starts and ends. This is simplified in the device according to the invention, as the beginning of the discharging of the capacitor C is determined by the well-defined rear edge of the sample pulse TG, which is supplied as one input to the nor-circuit 8. Regarding the end of the discharging of the capacitor C, this is always discharged down to a predetermined constant voltage level, which is independent of the magnitude of the voltage U to which the capacitor has been previously charged, wherefore the problem of detecting and determining the end of the discharging of the capacitor C is reduced to the much simpler problem of providing a pulse shaper 7, which reacts rapidly and accurately upon the interruption of the current in the constant current path 6.

As illustrated in the more detailed circuit diagram in FIG. 2, the direct current source 4 in the block diagram in FIG. 1 may consist of two transistors 9 and 10 connected as illustrated in FIG. 2. The output of the sample pulse generator 5 is connected to the base of the transistor 9, which has in its collector circuit a voltage divider, to which the base of the transistor 10 is connected. A positive sample pulse TG on the output of the sample pulse generator 5 will consequently turn on the transistor 9 to its conducting state, which causes in its turn that also the transistor 10 is turned on and conducts current to the junction between the diodes 2 and 3. When the sample pulse TG from the sample pulse generator 5 ends, the transistor 9 is cut off, which causes that also the transistor 10 is cut off, whereby the charging of the capacitor C is interrupted and the voltage across the capacitor C can no longer be effected by the voltage on the output of the amplifier 1.

The constant current path 6 in the block diagram in FIG. 1 consists preferably of a transistor 11 which has its emitter-collector path connected in parallel across the capacitor C and its base biased to keep the transistor in a fully conducting saturated state, in which state the current through the transistor 11 is constant and independent of external influences, as for instance temperature variations. This current, which constitutes the discharge current of the capacitor C, will continue to flow until the voltage across the capacitor C is reduced to a value equal to the collector-emitter voltage drop of the transistor 11 and the voltage drop across the resistance in the emitter circuit of the transistor 11. The collector-emitter voltage drop of the transistor is very constant and independent of temperature variations, wherefore the capacitor C is always discharged down to a constant and well-defined voltage level.

The pulse shaper 7 in the block diagram in FIG. 1 consists preferably of a second transistor 12, which has its base connected to the base of the transistor 11 and its base-emitter path connected in parallel to the base-emitter path of the transistor 11. The collector of this second transistor 12 forms the output of the pulse shaper. It is appreciated that the transistor 12 will be kept in a conducting state so long as current flows through the collector-emitter path of the transistor 11, wherefore under these conditions the voltage on the collector of the transistor 12 is low. When the collector-emitter current through the transistor 11 ceases, i.e. when the capacitor C is fully discharged, the voltage on the base of the transistor 11 and thus also on the base of the transistor 12 decreases, as base-emitter current starts to flow through the transistor 11, wherefore the transistor 12 is cut off and the voltage on its collector increases. This cut off of the transistor 12 can be accelerated by means of a suitable feedback from the collector of the transistor 12 to its emitter.

What is claimed is:

1. Device for converting an analogous signal having a varying amplitude into a pulse series having a pulse width proportional to the prevailing amplitude of the analogous signal, comprising means responsive to said analogous signal for providing an electric potential proportional to the prevailing amplitude of the analogous signal; a capacitor; a current source; a sample pulse generator for generating repetitive sample pulses; means responsive to said sample pulses for connecting said capacitor operatively to said potential and said current source for the duration of each sample pulse for charging said capacitor from said current source up to said potential; a constant current discharge path having a constant current value lower than the current value of said current source and permanently connected directly across said capacitor; current detecting means for detecting the presence and absence of a current flow in said constant current discharge path and producing an output signal in the absence of a current flow in said constant current discharge path; and NOR circuit means having a first input receiving said sample pulses and a second input receiving said output signal of said current detecting means and an output on which said pulse series having a pulse width proportional to the prevailing amplitude of the analogous signal is provided.

2. A device as claimed in claim 1, wherein said constant current discharge path includes a first transistor connected with its collector-emitter path in parallel across said capacitor and maintained permanently biased in its saturated, fully conducting state, and said current detecting means include a second transistor having its base interconnected with the base of said first transistor and its base-emitter path connected in parallel to the base-emitter path of said first transistor, and said output signal being provided on the collector of said second transistor.

3. A device a claimed in claim 1, wherein said current source is responsive to said sample pulses to be turned-on for the duration of each sample pulse and turned-off during the intervals between successive sample pulses, and said means for connecting said capacitor to said potential and said current source include two diodes connected in series opposition between said potential and said capacitor, and said current source being connected to supply current to the junction between said two diodes in the forward direction of the diodes.

* * * * *